United States Patent
Maytum et al.

[11] Patent Number: 5,838,057
[45] Date of Patent: Nov. 17, 1998

[54] TRANSISTOR SWITCHES

[75] Inventors: Michael Maytum, Willington; David Garnham, Shainbrook, both of England

[73] Assignee: Texas Instruments Incorporated, Dallas, Tex.

[21] Appl. No.: 285,479

[22] Filed: Aug. 3, 1994

[51] Int. Cl.[6] .......................... H01L 27/082; H01H 47/00
[52] U.S. Cl. ........................... 257/577; 257/610; 307/125
[58] Field of Search ................................. 257/577, 590, 257/610, 544; 307/125

[56] References Cited

U.S. PATENT DOCUMENTS 5,343,068  8/1994  Frisina et al. ............................ 257/577
5,469,103  11/1995  Shigekane .................................. 257/577

Primary Examiner—Mark V. Prenty
Attorney, Agent, or Firm—Christopher L. Maginniss; James C. Kesterson; Richard L. Donaldson

[57] ABSTRACT

An electronic switch (80) having a transistor (T) and a diode (D) formed on a substrate (82) is provided. The electronic switch (80) includes a common transistor collector and diode cathode region (81) of a first conductivity type formed in the substrate (82). The switch (80) also includes a transistor base region (83) of a second conductivity type formed in a first section of the collector region (81) and a transistor emitter region (84) of the first conductivity type formed in a section of the base region (83). Additionally, the electronic switch (80) includes a diode anode region (85) formed of the second conductivity type and in a second section of the collector region (81). At least a portion of the anode region (85) is selectively doped with a metallic dopant to provide centers for charge carrier recombination so as to decrease the recovery time of the diode (D).

12 Claims, 5 Drawing Sheets

TRANSISTOR SWITCHES

TECHNICAL FIELD OF THE INVENTION

The present invention relates to transistor switches and in particular to the integration of a switching transistor with a reverse current diode as is necessary, for example, in applications where inductive loads are switched.

BACKGROUND OF THE INVENTION

When a diode is formed integrated with a transistor it is convenient to form the diode in the semiconductor material which forms the collector of the transistor straightforwardly to provide the required common connection therebetween. Unfortunately, the characteristics of material chosen to provide a good switching transistor do not yield a diode performance that is acceptable in all applications. This problem is particularly severe when a high voltage, high power switch is considered. An example of an application where the performance of a straightforwardly integrated transistor has proved unsatisfactory is in the inverter circuit of a fluorescent lamp.

Standard fluorescent lamps are extensively used in industrial and commercial environments. Compared to incandescent bulbs, fluorescent lamps have lower energy consumption and longer life, but in most domestic applications these advantages have been outweighed by the fluorescent's fitting size, the need for extra control gear, and higher initial cost. As a result, their use has been very selective. Also for applications like task lighting, a concentrated light source is needed rather than the distributed source given by the conventional fluorescent lamp.

For these reasons there is still an enormous market for incandescent (filament) bulbs. Recognizing the need for a small efficient light source, lamp manufacturers have developed a range of compact fluorescent lamps. Small size is achieved by reducing the glass tube diameter and folding the tube one or more times. As with conventional fluorescent lamps, these compact fluorescents still require a ballast and a starter. To minimize size, the starter may be built into the tube base as a glow starter. Coupling such a compact fluorescent tube with ballast mounted in an adapter provides a light source that can replace incandescent bulbs.

Combining a compact fluorescent with a conventional 50/60 Hz ballast results in a light source that has restricted applications. In addition to higher additional cost with respect to a filament bulb, the weight and bulk of the ballast makes the resulting light source non-retrofittable in many incandescent bulb fittings. Physical size is, for example, a factor in determining the acceptability of these fittings with the desire that size be reduced as much as possible. This drives the need to integrate the electronic ballast components into the light source.

To address these problems, smaller lightweight electronic ballasts have been developed to replace the 50/60 Hz ballasts. In some cases, such compact lamps are not always compatible with the electronic ballast operation. Lamps may either flicker continuously or at random times during running. This problem results when the lamp's glow starter is activated by the high frequency alternating current generated by the electronic ballast. To alleviate the flickering, a new range of compact light sources has been developed that do not contain a glow starter. This range of lamps is characterized by four connecting pins (two for each heater) compared to the previous two pin lamps that included an integrated starter.

Operating a fluorescent tube at high frequency reduces the power required for a given light level. A 12 W, 50 Hz rated tube might need only 10 W at high frequencies to produce the same light output. At the system level, the total power drain from the system supply might be 14 W for a 50 Hz ballast and only 11 W for a high frequency ballast. So generally a high frequency electronic ballast system draws less power than the comparable 50 Hz operated tube. The key to this is that the high frequency ballast must have low losses. In particular, electronic switches that generate high frequency alternating current need to be stable and low loss in addition to providing the necessary high voltage operation and reverse current performance. Current reversal as a result of a switching transient is normally dealt with by providing an anti-parallel diode. In a high voltage application where the reverse current is likely to be high, the anti-parallel diode will be physically large, as will the transistor itself.

SUMMARY OF THE INVENTION

According to the present invention and in one aspect thereof, there is provided an electronic switch that substantially eliminates or reduces disadvantages and problems associated with previously developed electronic switches.

One aspect of the present invention provides an electronic switch having a transistor and a diode formed on a substrate having an outer surface. The electronic switch includes a common transistor collector and diode cathode region of a first conductivity type formed in the substrate. The switch also includes a transistor base region of a second conductivity type formed in a first section of the collector region and a transistor emitter region of the first conductivity type formed in a section of the base region. Additionally, the electronic switch includes a diode anode region formed of the second conductivity type and in a second section of the collector region. At least a portion of the anode region is selectively doped with a metallic dopant to provide centers for charge carrier recombination so as to decrease the recovery time of the diode.

Another aspect of the present invention provides a circuit for converting a low frequency AC input signal to a high frequency AC output signal. The circuit includes rectifier and filter circuitry for converting the low frequency AC input signal to a DC signal and a frequency inverter for converting the DC signal to the high frequency AC output signal. The frequency inverter includes at least one electronic switch having a transistor and a diode formed on a substrate having an outer surface. The electronic switch contains a common transistor collector and diode cathode region of a first conductivity type formed in the substrate and a transistor base region of a second conductivity type formed in a first section of the collector region. The electronic switch further includes a transistor emitter region of the first conductivity type formed in a section of the base region and a diode anode region formed of the second conductivity type and in a second section of the collector region. At least a portion of the anode region is selectively doped with a metallic dopant to provide centers for charge carrier recombination so as to decrease the recovery time of the diode.

Yet another aspect of the present invention provides a method for forming an electronic switch including a transistor and a diode formed on a substrate having an outer surface. The method includes the steps of forming a common transistor collector and diode cathode region of a first conductivity type in the substrate. The method further includes forming a transistor base region of a second conductivity type in a first section of the collector region and forming a transistor emitter region of the first conductivity type in a section of the base region. Additionally, the method includes forming a diode anode region of the second conductivity type in a second section of the collector region and selectively doping at least a portion of the anode region with a metallic dopant to provide centers for charge carrier recombination so as to decrease the recovery time of the diode.

In particular the invention provides an integrated transistor and anti-parallel diode in semiconductor material having characteristics suitable for switching.

BRIEF DESCRIPTION OF THE DRAWINGS

For a more complete understanding of the present invention and advantages thereof, reference is now made to the following description taken in conjunction with the accompanying drawings in which like reference numbers indicate like features and wherein.

DETAILED DESCRIPTION OF THE INVENTION

Preferred embodiments of the present invention are illustrated in the FIGS. 5 and 7–12, like numerals being used to refer to like and corresponding parts of the various drawings.

A basic function of an electronic ballast is to convert alternating current at line frequency to a much higher frequency, usually on the order of 30–40 kHz region. It is overly complex to do a direct low frequency to high frequency conversion, so a two stage process is normally used. The alternating current supply is first rectified to direct current, and this direct current is chopped at high frequency to produce the high frequency alternating current that may be used, for example, to power a lamp.

Figure 1:
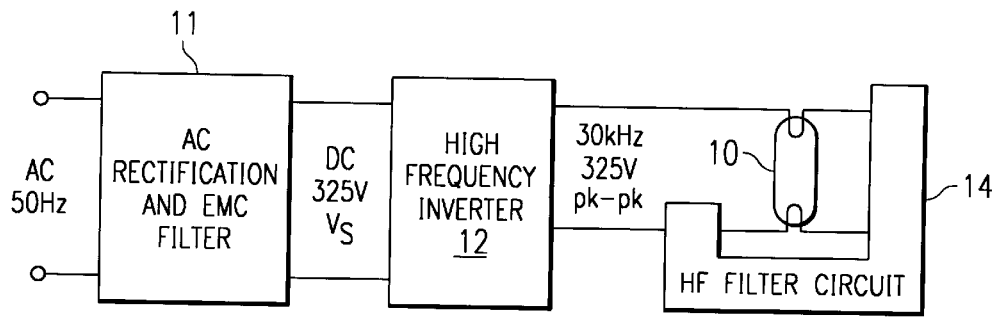
FIG. 1 is a block diagram of an electronic ballast.

FIG. 1 illustrates an electronic ballast arrangement for driving a fluorescent tube 10. In the circuit of FIG. 1, an alternating current 50 Hz supply is received at rectifier and EMC filter 11. A direct current supply voltage $V_S$, for example 325V, is provided to high frequency inverter 12 that provides, for example a 30 kHz, 325V peak-to-peak supply to tube 10. Associated with tube 10 is high frequency filter circuit 14.

Most European electronic ballasts are based on the principle of full wave rectifying the 50 Hz alternating current supply to produce a direct current supply voltage, $V_S$, in the range of 250 to 370V. (A boost converter is used to provide electronic power factor correction with the direct current rail voltage being higher, typically in the region of 400V). This direct current supply then feeds a half "H" bridge inverter switching at 30 to 40 kHz. The high frequency waveform produced by the inverter then powers one or more fluorescent tubes via an LC filter network. High frequency inverter section 12 may contain electronic switches which may be in accordance with the present invention. An embodiment for high frequency inverter 12 will now be considered in more detail.

The function of inverter 12 is to chop the direct current voltage produced by the alternating current rectification into high frequency alternating current. There are several forms inverter 12 can take. One is a push-pull configuration. Here, both switches have one connection made to a common supply rail with the other sides of the switches connecting to a (filter) transformer. Another common arrangement is the half "H" bridge. In this case two switches are series connected across a supply and the high frequency output is taken from the common connection. Only the operation of the half "H" bridge will be described in detail. It will be appreciated however that the present inventive switch is not limited to a half "H" bridge nor even to inverters used in electronic lighting applications. It can be used in other power switching applications.

Figure 2:
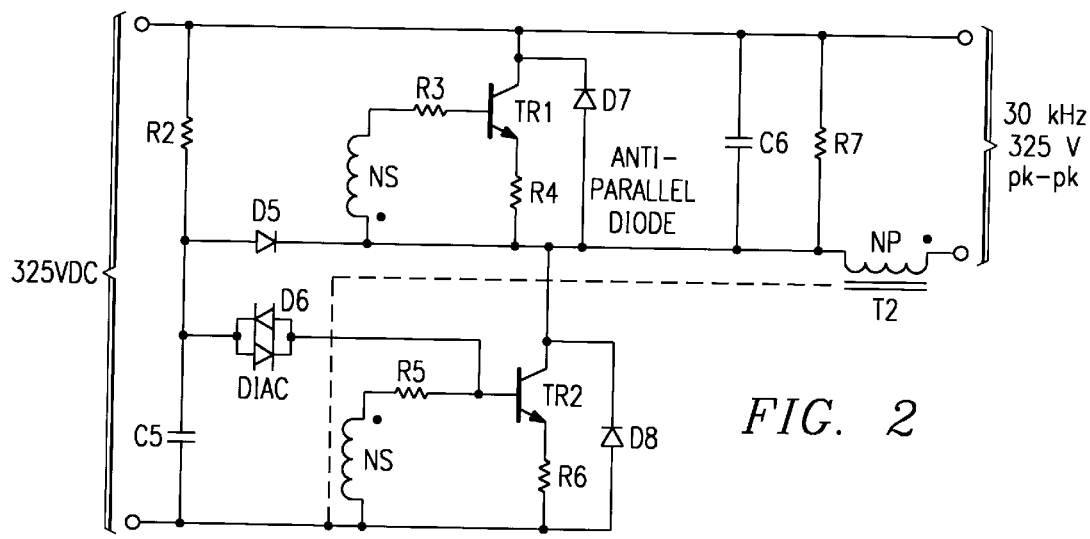
FIG. 2 illustrates a schematic diagram for a high frequency inverter.

FIG. 2 shows a half "H" bridge formed by transistor switches TR1 and TR2, and their respective anti-parallel diodes D7 and D8. Diodes D7 and D8 are included to carry load current reversals in their respective transistor switches. Resistor R2, capacitor C5, and diac D6, form a relaxation-oscillator that "kicks" transistor TR2 into conduction. Resistor R7 pulls the collector voltage of transistor TR2 to the positive supply rail to ensure the correct start up bias. Once transistor TR2 conducts, self-oscillation is maintained by the positive feed-back from the driver transformer T2. In an alternative arrangement, transistors TR1 and TR2 may be driven from an external oscillator. This increases circuit complexity but allows for incorporating additional features like dimming and remote control. So called "snubber" capacitor C6 slows down the waveform edges as switches TR1 and TR2 turn on and off. This reduces switch dissipation and waveform harmonics.

Emitter resistors R4 and R6, although representing a slight efficiency loss, develop an emitter bias voltage which is dependent on load current. This gives an enhanced level of transistor reverse base current during turn off and helps to equalize any transistor turn off time difference. Also, during start up and fault conditions, the high voltage level developed across resistors R4 and R5 help to limit the peak currents in the transistors. The transistor base turn-off current, $I_{boff}$ of transistor TR1, is determined by its series base resistance (R3), transformer secondary (NS) winding voltage, base emitter voltage, $V_{BE}$, and the voltage developed across emitter resistor R4.

Figure 3:
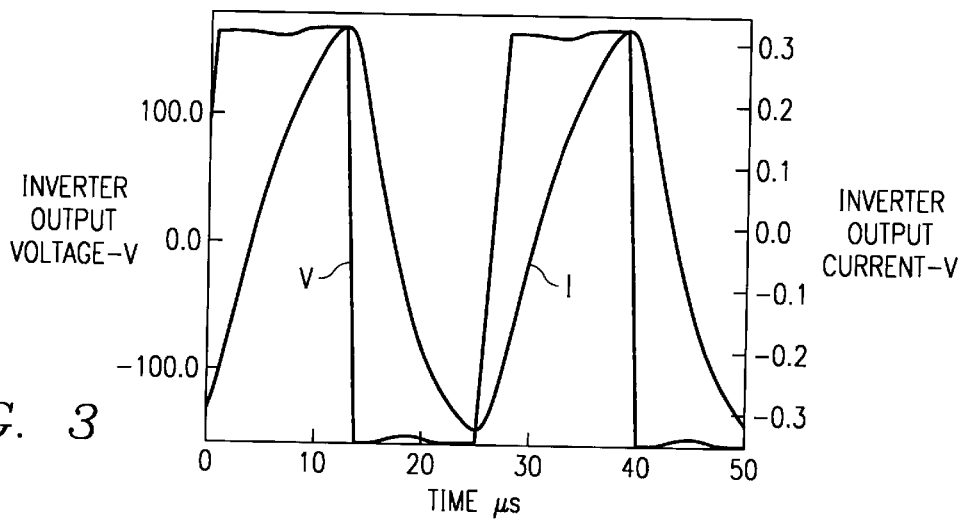
FIG. 3 illustrates inverter current and voltage waveforms.
Figure 4A:
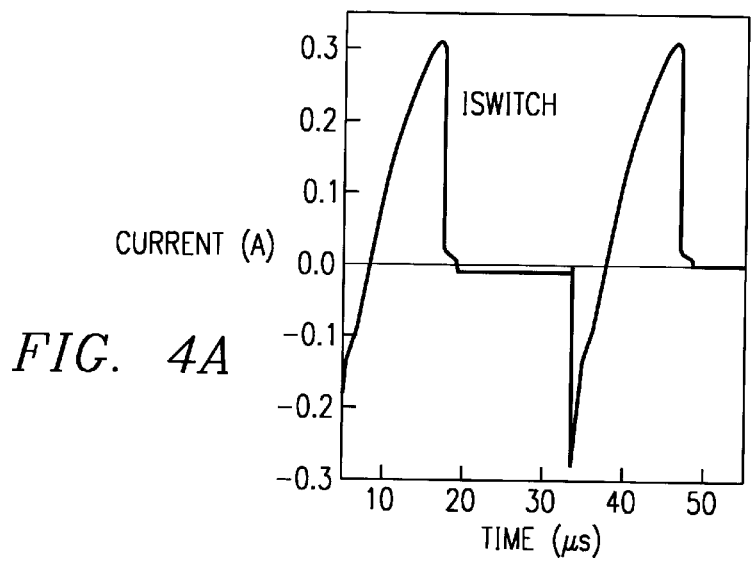
FIGS. 4A and 4B show switching current waveforms.
Figure 4B:
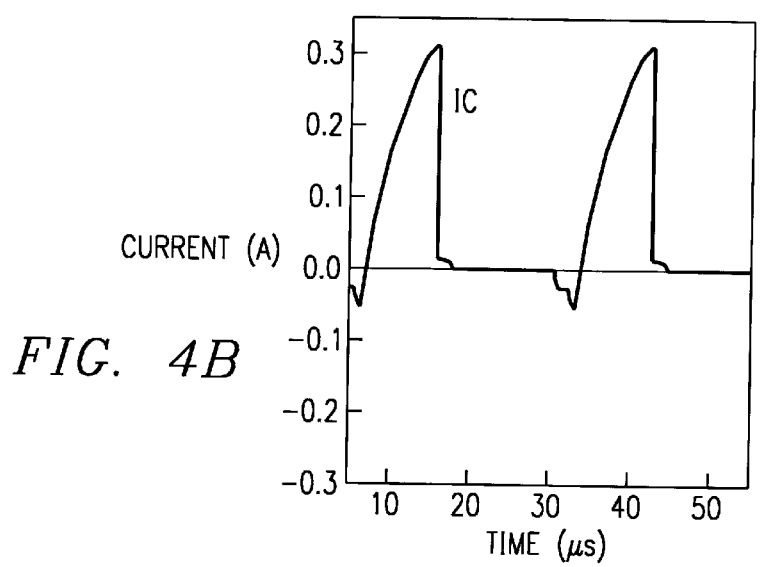

Continuing the example of FIG. 2, FIG. 3 shows the output voltage V, and current I for the inverter. It will be seen that the load (lamp) current changes polarity during the switch conduction time. This current reversal necessitates anti-parallel diodes D7 and D8. FIG. 4A shows the actual switch current ($I_{switch}$) flowing through a transistor and its associated anti-parallel diode, while FIG. 4B shows that part of the switch current that flows through the transistor's collector ($I_C$).

Integration of the diode and transistor, e.g., D7 and TR1, is simplified if the diode-anode connection is moved to the transistor's emitter. With an integrated diode and transistor 50 (FIG. 5) the arrangement will be such that the emitter resistor R4 of the circuit of FIG. 2 would be, for example, connected as shown in FIG. 5.

Figure 5:
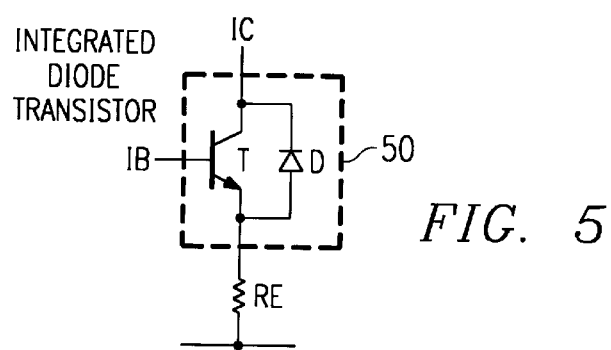
FIG. 5 depicts a circuit schematic for an integrated diode.

FIG. 5 shows integrated transistor and diode 50 containing transistor T, and diode D. Coupled to the emitter of transistor T and the anode of diode D is emitter resistor Re. Straightforward integration of the transistor and diode has two major effects on the switch's operating frequency. First, transistor T has the total switch current flowing through it. This increased charge level lengthens the transistors' storage time. This, in turn, lowers the operating frequency of a self-oscillating inverter. This drop in operating frequency can normally be corrected back to the original value by increasing the value of emitter resistor Re. Secondly, the operating frequency drops due to the longer diode recovery time. Essentially transistor T has to wait for diode D to recover before it can start its normal conduction. Therefore, to achieve efficient operation, diode D recovery time should be short. Unfortunately, in previously developed switches, the integrated diode has been formed from the same material as the transistor's collector region. This material requirement results in diode D that is not optimized for fast recovery. Slow diode recovery makes the inverter circuit containing the integrated transistor diode unstable for certain fluorescent lamps, and provides a circuit of inferior performance to that having a discrete diode, which may be separately optimized as a fast recovery device.

For example, after switch-on, fluorescent lamps take some time to achieve a stable running condition. The inverter sees this as a load current change with time. Unfortunately this change creates a positive feedback effect in the straightforwardly integrated diode transistor. If the negative (diode) current increases, the diode will take longer to recover. This in turn causes the frequency of a self-oscillating inverter to decrease. This frequency decrease may cause the load current to increase, that in turn will increase the diode current and decrease the frequency still further. The net result is that the change in operating conditions that this causes may prevent the design of an inverter that produces a stable output as the lamp loading changes.

Therefore, an integrated diode with a comparable recovery time to an optimized discrete diode is required to obtain adequate circuit performance.

The present transistor switch provides an integrated fast recovery diode through selective doping of the semiconductor material of the diode and the collector of the switching transistor. The doping provides centers for charge carrier recombination, and suitable dopants are, for example, gold and platinum.

Figure 6:
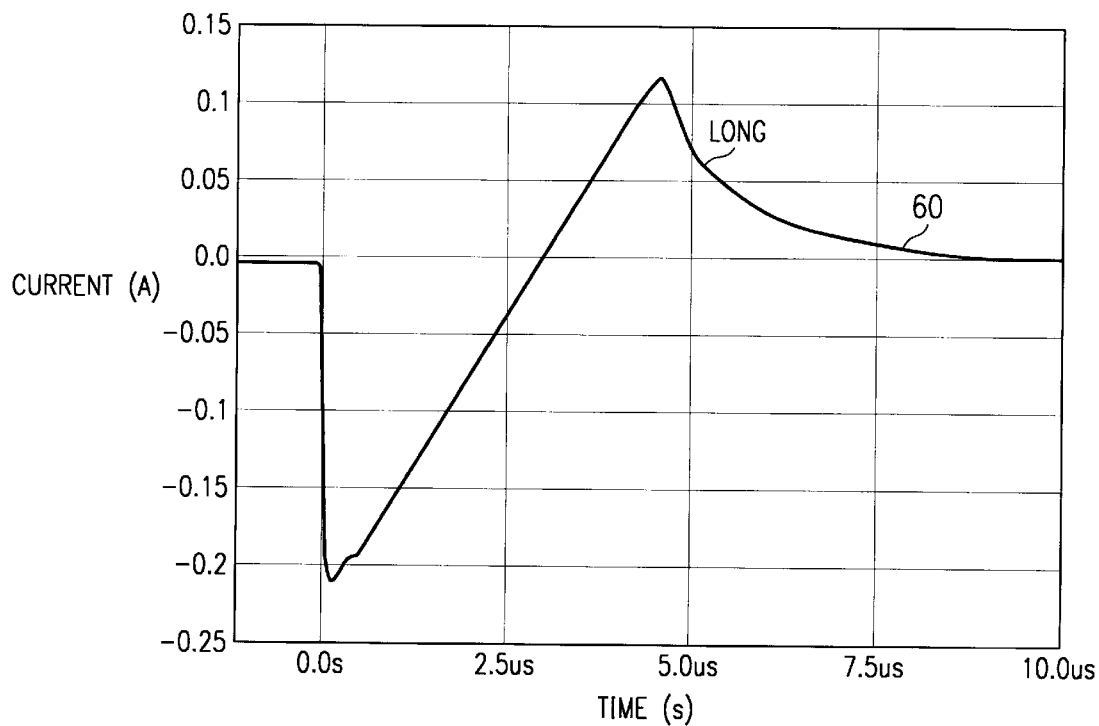
FIG. 6 shows the reverse recovery characteristic of a straightforwardly integrated diode.
Figure 7:
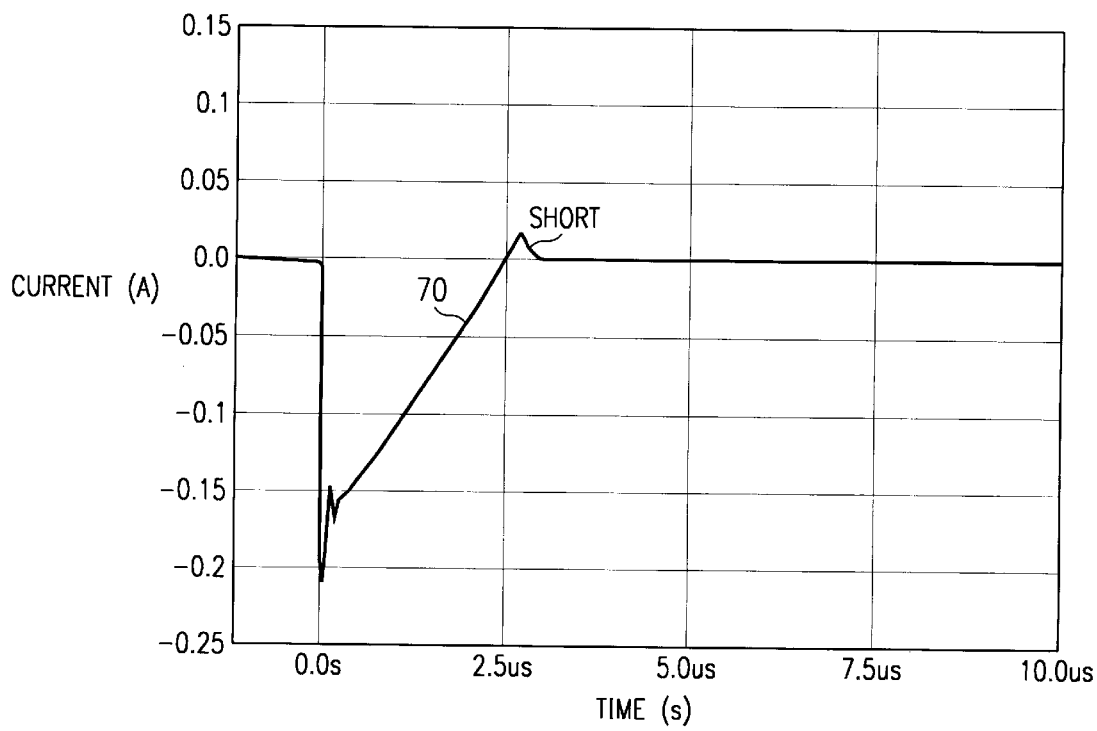
FIG. 7 shows the reverse recovery characteristic of a diode integrated in accordance with the present invention.

FIG. 6 shows the recovery characteristic for a previously developed straightforwardly integrated diode where long recovery time portion 60 may be observed. FIG. 7 shows the characteristic of the diode of the integrated device of the present invention wherein a much shorter recovery time portion 70 is achieved. The structure of an exemplary device will now be considered.

Figure 8:
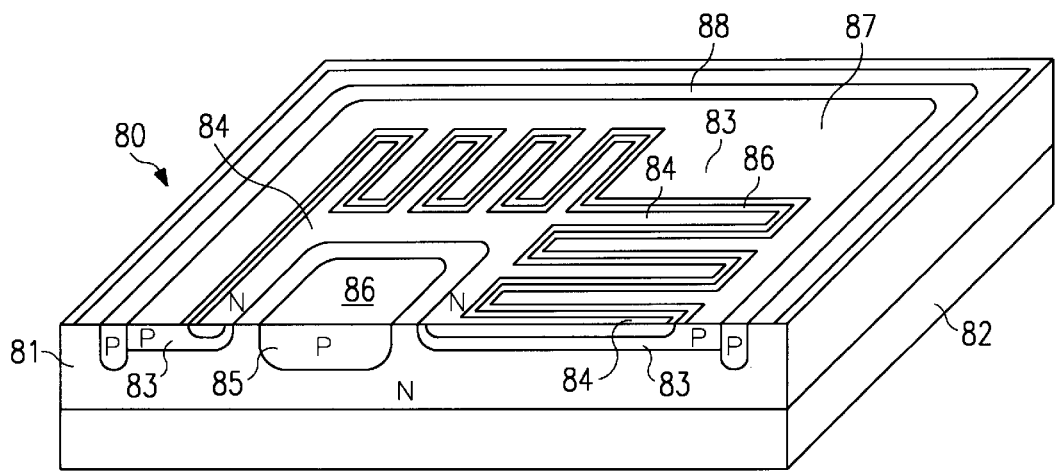
FIGS. 8 through 12 illustrate fabrication steps for an embodiment of the present invention.
Figure 9:
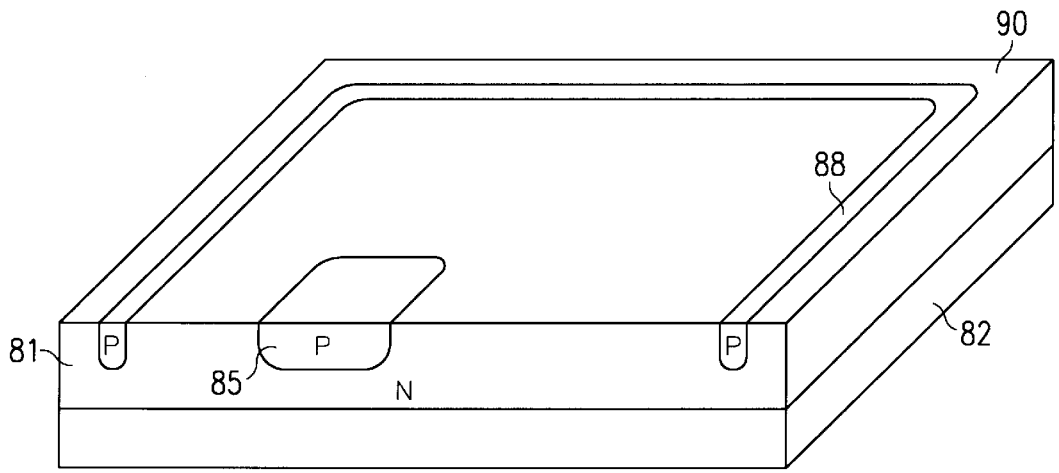
Figure 10:
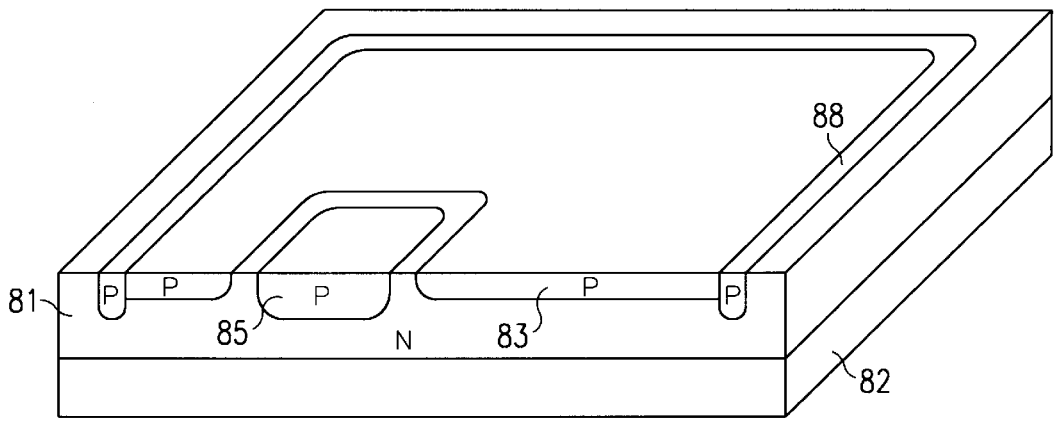

FIG. 8 shows device 80 in accordance with the present invention. Device 80 includes n-type collector region 81 formed in silicon substrate 82 chosen for a switching application. P-type base region 83 is formed in the surface of collector region 81 and n-type emitter region 84 is formed in the surface of base region 83. It will be observed that the size and shape of the regions is in accordance with known high voltage/power switching transistor principles.

In addition to the transistor thus far described, p-type region 85 is formed to provide a junction diode in connection with transistor collector region 81. P-type implant 88 circumscribes the device to act as a field spreader. Commonly connected transistor collector and diode cathode may be contacted via the rear surface of the die. Metal layer regions 86 and 87 are placed to contact the emitter and bases respectively. Metal layer region 86 also overlies the diode region 85 to provide a common anode/emitter contact. Diode anode region 85 is selectively gold doped to provide a fast recovery diode leaving the performance of the switching transistor substantially unchanged.

The fabrication of the integrated transistor/diode device of FIG. 8 will now be described. The starting material is 60–80 Ω/cm float-zone silicon. The silicon may then be doped with, for example, phosphorus through deposition at 1200° C., using, for example, phosphorous oxychloride (POCL$_3$) as a dopant source for 4 hours, and then diffused at 1325° C. for 156 hours to achieve a penetration of 9.5 mils. A surface of the wafer may then be ground and polished to give a substrate 82 (FIG. 9) having n-type collector region 81 extending to the upper surface. This material will be recognized as suitable for the fabrication of a high voltage power switching transistor. The surface may then be covered with an oxide layer 90 on the order of 0.8 μm or more that may then be patterned and selectively removed to allow p-type implant region 88 to be formed by implantation. The implant may be boron, on the order of $7.0 \times 10^{12}$ ions/cm$^2$ that may then be diffused, for example, for 60 hours at 1300° C., giving a penetration of 4.4 μm. Oxide layer 90 may then be selectively removed to allow diode region 85 to be formed by implantation and diffusion (for example, boron implant $5.2 \times 10^{14}$ diffused for 2.2 hours at 1300° C. (penetration 0.64 μm)).

Figure 11:
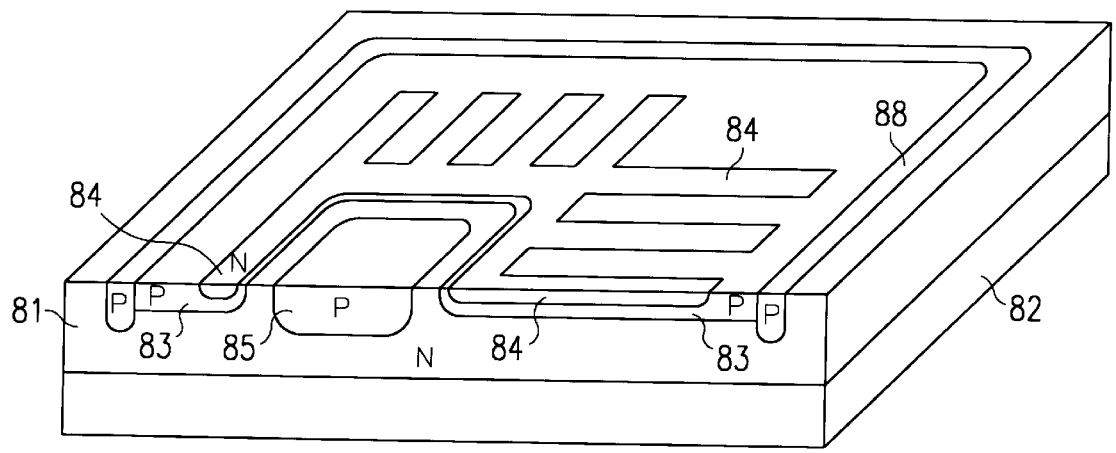
Figure 12:
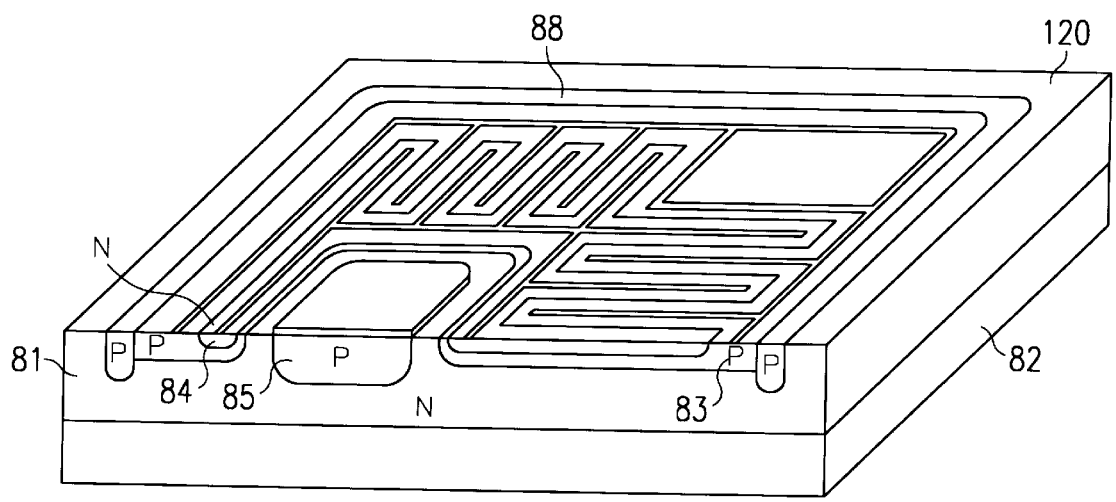

After further selective oxide removal, another boron implant diffusion may be made (for example, $5.2 \times 10^{14}$ diffused for 2.2 hours at 1300° C.) forming base region 83 (FIG. 10) and further driving in diode anode region 85. During the formation of base region 83 an oxide layer may be formed and patterned for selective removal and phosphorus deposition. Phosphorous may be diffused, for example, for 110 minutes at 110° C., giving a penetration on the order of 0.62 μm to create emitter region 84 (FIG. 11). Next, the oxide may be patterned and selectively removed in preparation for the metal contact layer.

A layer of resist 120 may be, for example, spun on and patterned (FIG. 12) to allow a selective doping in diode region 85. The doping may be achieved, for example, by gold implantation ($1 \times 10^{13}$) into the resist and patterned areas. The resist is then removed leaving the gold in the patterned area that is then diffused, for example, for 15 minutes at 900° C. The switching speed for the present switch may be varied by modifying this doping profile. Finally, a layer of aluminum may be added to provide the electrical contacts to the upper surface after selective removal.

The resultant device (FIG. 8) is an integrated transistor and diode suited for switching applications. The gold doping applied selectively to only the diode gives improved recovery performance without affecting transistor performance. This will be contrasted with global gold doping techniques.

Devices of the type described have been successfully fabricated on 92 to 165 mil square dies on 100 mm diameter wafers.

Although the present invention has been described in detail, it should be understood that various changes, substitutions, and alterations can be made hereto without departing from the spirit and scope of the invention as defined by the appended claims.

What is claimed is:

1. An electronic switch comprising a transistor and a diode formed on a substrate having an outer surface, the electronic switch comprising:

a common transistor collector and diode cathode region of a first conductivity type formed in the substrate;

a transistor base region of a second conductivity type formed in a first section of the collector region;

a transistor emitter region of the first conductivity type formed in a section of the base region;

a diode anode region formed of the second conductivity type and in a second section of the collector region, and wherein at least a portion of the anode region is selectively doped with a metallic dopant to provide centers for charge carrier recombination so as to decrease the recovery time of the diode; and a field spreader region formed of the second conductivity type in the collector region and encircling the transistor and diode.

2. The electronic switch of claim 1 wherein the dopant comprises gold.

3. The electronic switch of claim 1 wherein the dopant comprises platinum.

4. The electronic switch of claim 1 wherein the at least a portion of the anode region comprises the entire anode region.

5. The electronic switch of claim 1 wherein the first conductivity type further comprises an n-type region.

6. The electronic switch of claim 1 wherein the second conductivity type further comprises a p-type region.

7. A circuit for converting a low frequency AC input signal to a high frequency AC output signal, the circuit comprising:

rectifier and filter circuitry for converting the low frequency AC input signal to a DC signal; and a frequency inverter for converting the DC signal to the high frequency AC output signal, the frequency inverter further comprising at least one electronic switch having a transistor and a diode formed on a substrate having an outer surface, the electronic switch comprising, a common transistor collector and diode cathode region of a first conductivity type formed in the substrate, a transistor base region of a second conductivity type formed in a first section of the collector region, a transistor emitter region of the first conductivity type formed in a section of the base region, a diode anode region formed of the second conductivity type and in a second section of the collector region, and wherein at least a portion of the anode region is selectively doped with a metallic dopant to provide centers for charge carrier recombination so as to decrease the recovery time of the diode, and a field spreader region formed of the second conductivity type in the collector region and encircling the transistor and diode.

8. The circuit of claim 7 wherein the dopant comprises gold.

9. The circuit of claim 7 wherein the dopant comprises platinum.

10. The circuit of claim 7 wherein the at least a portion of the anode region comprises the entire anode region.

11. The circuit of claim 7 wherein the first conductivity type further comprises an n-type region.

12. The circuit of claim 7 wherein the second conductivity type further comprises a p-type region.

* * * * *